US012640685B2

(12) United States Patent
    Lomen

(10) Patent No.:    US 12,640,685 B2
(45) Date of Patent:        May 26, 2026

(54) SYSTEMS, METHODS, AND DEVICES FOR ELECTROMAGNETIC MODULATION

(71) Applicant: The MITRE Corporation, McLean, VA (US)

(72) Inventor: Brandt James Lomen, Bedford, NH (US)

(73) Assignee: The MITRE Corporation, McLean, VA (US)

( * ) Notice: Subject to any disclaimer, the term of this patent is extended or adjusted under 35 U.S.C. 154(b) by 0 days.

(21) Appl. No.: 18/418,599

(22) Filed: Jan. 22, 2024

(65) Prior Publication Data

US 2025/0239972 A1      Jul. 24, 2025

(51) Int. Cl.
    *H03C 1/52*        (2006.01)
    *G01S 13/74*       (2006.01)
    *G01S 13/75*       (2006.01)
    *H03C 7/00*        (2006.01)
    *H04B 1/04*        (2006.01)

(52) U.S. Cl.
    CPC ............... *H03C 1/52* (2013.01); *G01S 13/74* (2013.01); *G01S 13/751* (2013.01); *H03C 7/00* (2013.01); *H04B 1/04* (2013.01); *H04B 2001/0491* (2013.01)

(58) Field of Classification Search
    CPC . H03C 7/00; G01S 13/74; G01S 13/75; G01S 13/751; G01S 13/758; G01S 13/767; G01S 13/76; H03B 1/04; H03B 1/40; H04B 1/54; H04B 1/59; H04B 5/45; H04B 5/48; H04B 5/77
    See application file for complete search history.

(56) References Cited

U.S. PATENT DOCUMENTS

| | | | |
|---|---|---|---|
| 7,184,716 B2 | 2/2007 | Mohan | |
| 2008/0225932 A1* | 9/2008 | Fukuda | .............. G06K 19/0723 |
| | | | 375/216 |
| 2014/0113555 A1* | 4/2014 | Wuidart | ........... G06K 19/07318 |
| | | | 455/41.1 |
| 2014/0225761 A1* | 8/2014 | Garrec | .................. G01S 13/872 |
| | | | 342/51 |

(Continued)

FOREIGN PATENT DOCUMENTS

| | | |
|---|---|---|
| CN | 115379380 A | 11/2022 |
| WO | 2022122155 A1 | 6/2022 |

OTHER PUBLICATIONS

Abidi. (Dec. 1995). "Direct-Conversion Radio Transceivers for Digital Communications," IEEE Journal of Solid-State Circuits 30(12):1399-1410.

(Continued)

*Primary Examiner* — Ryan Johnson
(74) *Attorney, Agent, or Firm* — Morrison & Foerster LLP

(57)        ABSTRACT

An electromagnetic modulation device may include a receiver configured to receive electromagnetic signals, a digital-to-analog converter configured to continuously generate a modulation signal, a mixer coupled to the receiver and the digital-to-analog converter and configured to encode the electromagnetic signals received by the receiver with the modulation signal generated by the digital-to-analog converter upon receipt of the electromagnetic signals by the receiver, and a transmitter coupled to the mixer and configured to transmit the encoded electromagnetic signals generated by the mixer.

32 Claims, 10 Drawing Sheets

(56)     References Cited

U.S. PATENT DOCUMENTS

| | | | |
|---|---|---|---|
| 2022/0171022 A1* | 6/2022 | Bourde | G01S 7/4095 |
| 2022/0299653 A1 | 9/2022 | Morales et al. | |
| 2023/0098464 A1 | 3/2023 | Haas et al. | |
| 2023/0228850 A1 | 7/2023 | Cochran et al. | |

OTHER PUBLICATIONS

Fudge et al. (Oct. 2008). "A Nyquist Folding Analog-To-Information Receiver," 5 pages.

* cited by examiner

108 Encoded Signal

102 Electromagnetic Modulation Device

218 Transmitter

214 Modulation Signal

216c

212 Digital-to-Analog Converter

216b

216 Mixer

216a

210 Receiver

220 Controller

106 Received Signal

102 Electromagnetic Modulation Device

SYSTEMS, METHODS, AND DEVICES FOR ELECTROMAGNETIC MODULATION

STATEMENT REGARDING FEDERALLY SPONSORED RESEARCH OR DEVELOPMENT

This invention was made with Government support under U.S. Government Contract No. FA8702-23-C-0001, awarded by the Air Force. The Government has certain rights in this invention.

FIELD

The present disclosure relates generally to devices and techniques for modulating electromagnetic signals.

BACKGROUND

Modulating electromagnetic signals is useful in a variety of situations. Scrambling or otherwise interfering with radar signals, for example, may protect military vehicles or vessels (e.g., aircraft or naval ships) from unwanted detection. Radio frequency identification (RFID) tags may modify radio waves transmitted by a RFID reader in order to communicate with the RFID reader.

Systems such as digital radio frequency memory (DRFM) systems modulate electromagnetic signals by digitizing incoming signals, storing copies of the signals in a digital memory, and retransmitting the stored signals as necessary, possibly with modifications that encode information. The components of these systems are frequently expensive. Furthermore, since these systems require incoming signals to be digitized prior to being retransmitted, there is a delay between the receipt of the signal and the emission of any modulated signals. In other words, existing systems that require the digitization of received electromagnetic signals do not allow the signals to be continuously modulated as they are received.

SUMMARY

Described are systems, devices, and methods for modulating electromagnetic signals without digitization. In a provided electromagnetic modulation device, an analog mixer may be used to combine incoming electromagnetic signals with a modulation signal to produce an encoded electromagnetic signal that is configured to communicate information back to a source of the incoming signals or to interfere with a source of the incoming signals.

The analog solution for modulation electromagnetic signals described herein may provide faster and more cost-effective modulation than provided by, e.g., DRFM systems that rely on digitization. As a result, the described systems, devices, and methods have a large number of potential use cases. For instance, the electromagnetic modulation devices provided herein can be implemented in radar interference systems, such as radar interference systems on military aircraft that prevent radar detection by the aircraft, as well as in electromagnetic tracking devices such as RFID tags.

An electromagnetic modulation device may comprise a receiver configured to receive electromagnetic signals, a digital-to-analog converter configured to continuously generate a modulation signal, a mixer coupled to the receiver and the digital-to-analog converter and configured to encode the electromagnetic signals received by the receiver with the modulation signal generated by the digital-to-analog converter upon receipt of the electromagnetic signals by the receiver, and a transmitter coupled to the mixer and configured to transmit the encoded electromagnetic signals generated by the mixer. The received electromagnetic signals may be input into the mixer through a local oscillator port of the mixer. The mixer can be a single side band mixer or a heterodyne mixer. The device may require less than 15 W of power to operate.

In some embodiments, the receiver comprises a first antenna, and the transmitter comprises a second antenna. In other embodiments, the receiver and the transmitter are the same device. A power limiter may be coupled to the receiver. The power limiter may be configured to attenuate an electromagnetic signal received by the receiver before the electromagnetic signal is transferred to the mixer if a power of the electromagnetic signal exceeds a threshold power level. A tunable bandpass filter can also be coupled to the receiver and configured to remove signals in one or more frequency ranges from the electromagnetic signals received by the receiver before the electromagnetic signals are transferred to the mixer.

A microcontroller may be configured to control the digital-to-analog converter. The microcontroller can be configured to control a frequency of the modulation signal, an amplitude of the modulation signal, a phase of the modulation signal, a wavelength of the modulation signal, or a combination thereof. The frequency of the modulation signal may be adjustable. In some embodiments the frequency of the modulation signal is greater than or equal to 1 Hz and less than or equal to 300 GHz.

A low-noise amplifier may be coupled to the mixer and configured to amplify the encoded electromagnetic signals generated by the mixer before the encoded electromagnetic signals are transferred to the transmitter. A power amplifier may be coupled to the mixer and configured to increase a power of the encoded electromagnetic signals generated by the mixer before the encoded electromagnetic signals are transferred to the transmitter.

In some examples, the electromagnetic signals received by the receiver are radar signals, and the modulation signal is configured to interfere with the radar signals. In other examples, the device is a component of a RFID tag. The electromagnetic signals received by the receiver may be signals emitted by a RFID reader and the modulation signal may comprise information associated with the RFID tag.

An electromagnetic modulation method may include receiving electromagnetic signals using a receiver, continuously generating a modulation signal using a digital-to-analog converter, encoding the electromagnetic signals received by the receiver with the modulation signal generated by the digital-to-analog converter upon receipt of the electromagnetic signals by the receiver using a mixer, and transmitting the encoded electromagnetic signals generated by the mixer. Encoding the electromagnetic signals received by the receiver with the modulation signal generated by the digital-to-analog converter upon receipt of the electromagnetic signals by the receiver using a mixer comprises inputting the received electromagnetic signals through a local oscillator port of the mixer.

In various embodiments, the method further comprises attenuating an electromagnetic signal received by the receiver before the electromagnetic signal is transferred to the mixer if a power of the electromagnetic signal exceeds a threshold power level using a power limiter, removing signals in one or more frequency ranges from the electromagnetic signals received by the receiver before the electromagnetic signals are transferred to the mixer using a tunable bandpass filter, amplifying the encoded electromagnetic signals generated by the mixer before the encoded electromagnetic signals are transferred to the transmitter using a low-noise amplifier, or increasing a power of the encoded electromagnetic signals generated by the mixer before the encoded electromagnetic signals are transferred to the transmitter using a power amplifier. In one or more examples of the method, the electromagnetic signals received using the receiver are radar signals, and continuously generating the modulation signal comprises configuring the modulation signal to interfere with the radar signals. In other examples of the method, the electromagnetic signals are received using the receiver are signals emitted by a RFID reader, and the modulation signal comprises information associated with the RFID tag.

An electromagnetic modulation system may comprise a source device configured to emit electromagnetic signals, an electromagnetic modulation device. The electromagnetic modulation device may include a receiver configured to receive electromagnetic signals from the source device, a digital-to-analog converter configured to continuously generate a modulation signal, a mixer coupled to the receiver and the digital-to-analog converter and configured to encode the electromagnetic signals received by the receiver with the modulation signal generated by the digital-to-analog converter upon receipt of the electromagnetic signals by the receiver, and a transmitter coupled to the mixer and configured to transmit the encoded electromagnetic signals generated by the mixer. The received electromagnetic signals may be input into the mixer through a local oscillator port of the mixer.

In some examples of the system, the electromagnetic modulation device comprises a power limiter coupled to the receiver and configured to attenuate an electromagnetic signal received by the receiver before the electromagnetic signal is transferred to the mixer if a power of the electromagnetic signal exceeds a threshold power level, a tunable bandpass filter coupled to the receiver and configured to remove signals in one or more frequency ranges from the electromagnetic signals received by the receiver before the electromagnetic signals are transferred to the mixer, a low-noise amplifier coupled to the mixer and configured to amplify the encoded electromagnetic signals generated by the mixer before the encoded electromagnetic signals are transferred to the transmitter, or a power amplifier coupled to the mixer and configured to increase a power of the encoded electromagnetic signals generated by the mixer before the encoded electromagnetic signals are transferred to the transmitter. The electromagnetic modulation device can also include a microcontroller configured to control the digital-to-analog converter. The microcontroller is configured to control a frequency of the modulation signal, an amplitude of the modulation signal, a phase of the modulation signal, a wavelength of the modulation signal, or a combination thereof.

In the electromagnetic modulation system, the source device can be a RFID reader and the electromagnetic modulation device is a component of a RFID tag. Alternatively, the source device can be a radar transmitter, and the electromagnetic modulation device is a component of a radar jammer.

BRIEF DESCRIPTION OF THE FIGURES

The following figures show various devices, systems, and methods for modulating electromagnetic signals. The devices, systems, and methods shown in the figures may have any one or more of the characteristics described herein.

DETAILED DESCRIPTION

Described herein are examples of systems, devices, and methods for continuously modulating electromagnetic signals as the signals are received. An analog mixer may be used to perform the modulation. When an incoming electromagnetic signal is received at a modulation device, the signal may be transmitted to the analog mixer of the modulation device, where it may be encoded with a modulation signal that the modulation device has generated. The encoded signal may then be retransmitted, potentially back to its source, to which it may convey information or with which it may interfere. Electromagnetic modulation systems and methods for modulating electromagnetic signals are also described.

A modulation device may modulate electromagnetic signals without digitizing said signals and, as a result, may be more cost effective than systems such as DRFM systems that rely on signal digitization. Furthermore, since the modulation device does not digitize incoming signals, the signals can be modulated and retransmitted as they are received by the modulation device. Modulation devices may be compact (e.g., as small as, or smaller than, a quarter) and the power requirements of the devices may be low (e.g., less than 15 W), enabling them to be implemented in a wide range of use cases. In particular, the electromagnetic modulation devices provided herein can be implemented in radar interference systems, for example radar interference systems on military aircraft that prevent radar detection by the aircraft, as well as in electromagnetic tracking devices such as RFID tags.

Any of the systems, methods, techniques, and/or features disclosed herein may be combined, in whole or in part, with any other systems, methods, techniques, and/or features disclosed herein.

As used herein, the singular forms "a", "an", and "the" include the plural reference unless the context clearly dictates otherwise.

Reference to "about" or "approximately" a value or parameter herein includes (and describes) variations of that value or parameter per se. For example, description referring to "approximately X" or "about X" includes description of "X" as well as variations of "X".

When a range of values or values is provided, it is to be understood that each intervening value between the upper and lower limit of that range, and any other stated or intervening value in that stated range, is encompassed within the scope of the present disclosure. Where the stated range includes upper or lower limits, ranges excluding either of those included limits are also included in the present disclosure.

Figure 1:
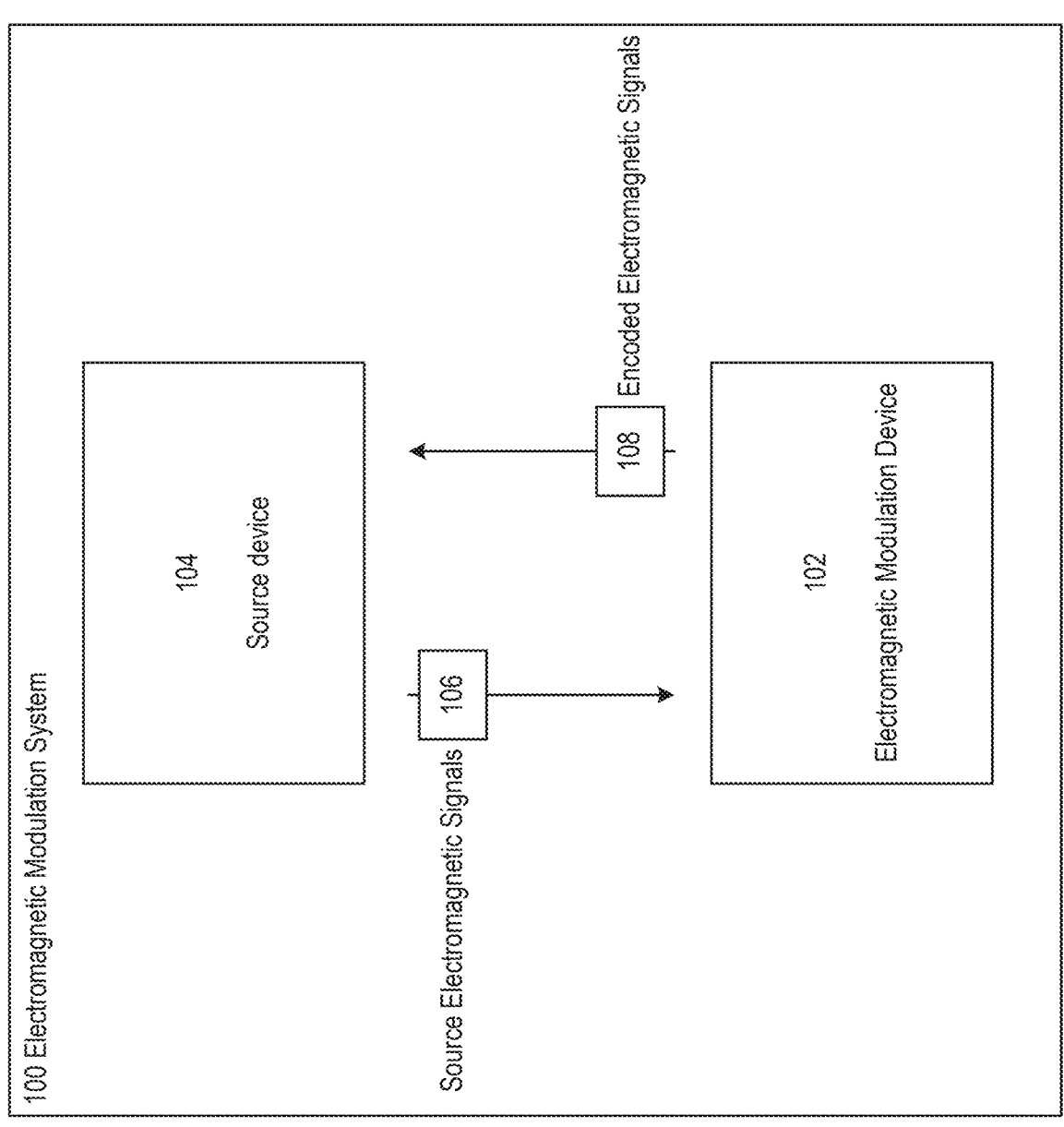
FIG. 1 shows an electromagnetic modulation system, according to some embodiments.

An exemplary electromagnetic modulation system 100 is shown in FIG. 1. System 100 may include an electromagnetic modulation device 102 and a source device 104. Electromagnetic modulation device 102 may receive electromagnetic signals 106 from source device 104. Signals 106 may be modulated by device 102 upon receipt. The modulated signals may encode a modulation signal that is generated by device 102. Device 102 may then retransmit the encoded electromagnetic signals 108 back to source device 104.

Device 102 may modulate an incoming signal 106 by adjusting the frequency of the signal, the wavelength of the signal, the phase of the signal, or combinations thereof. In some embodiments, device 102 may mix incoming signals 106 with a modulation signal using an analog mixer (e.g., a heterodyne mixer or a single side band mixer). Specifically, device 102 may input incoming signals 106 into a local oscillator port of an analog mixer and mix incoming signals 106 with a modulation signal input into an intermediate frequency port of the analog mixer. Device 102 may modulate incoming signals 106 without first digitizing incoming signals 106.

Device 102 may be utilized for a variety of purposes. For example, device 102 may be a component of a radar jamming system such as those found in military vessels (e.g., stealth aircraft). In such cases, source device 104 may be a radar transmitter that transmits radar signals 106 intended to locate the entity (e.g., the vessel) that includes device 102. When signals 106 encounter the entity that incudes device 102, they may be intercepted by device 102, which may immediately retransmit encoded signals 108. Encoded signals 108 may be configured to interfere with radar signals 106 or otherwise prevent source device 104 from detecting the location of the entity of which device 102 is a component. Device 102 can also be a component of a radio frequency identification (RFID) tag.

In some embodiments, device 102 is highly compact. A total area of device 102 may be less than or equal to 500 mm2, 400 mm2, 300 mm2, 200 mm2, 150 mm2, 125 mm2, 100 mm2, 75 mm2, 50 mm2, or 25 mm2. The total power requirements of device 102 may be low, for example less than 50 W, 40 W, 30 W, 20 W, 18 W, 15 W, 12 W, 10 W, 8 W, or 5 W.

Figure 2:
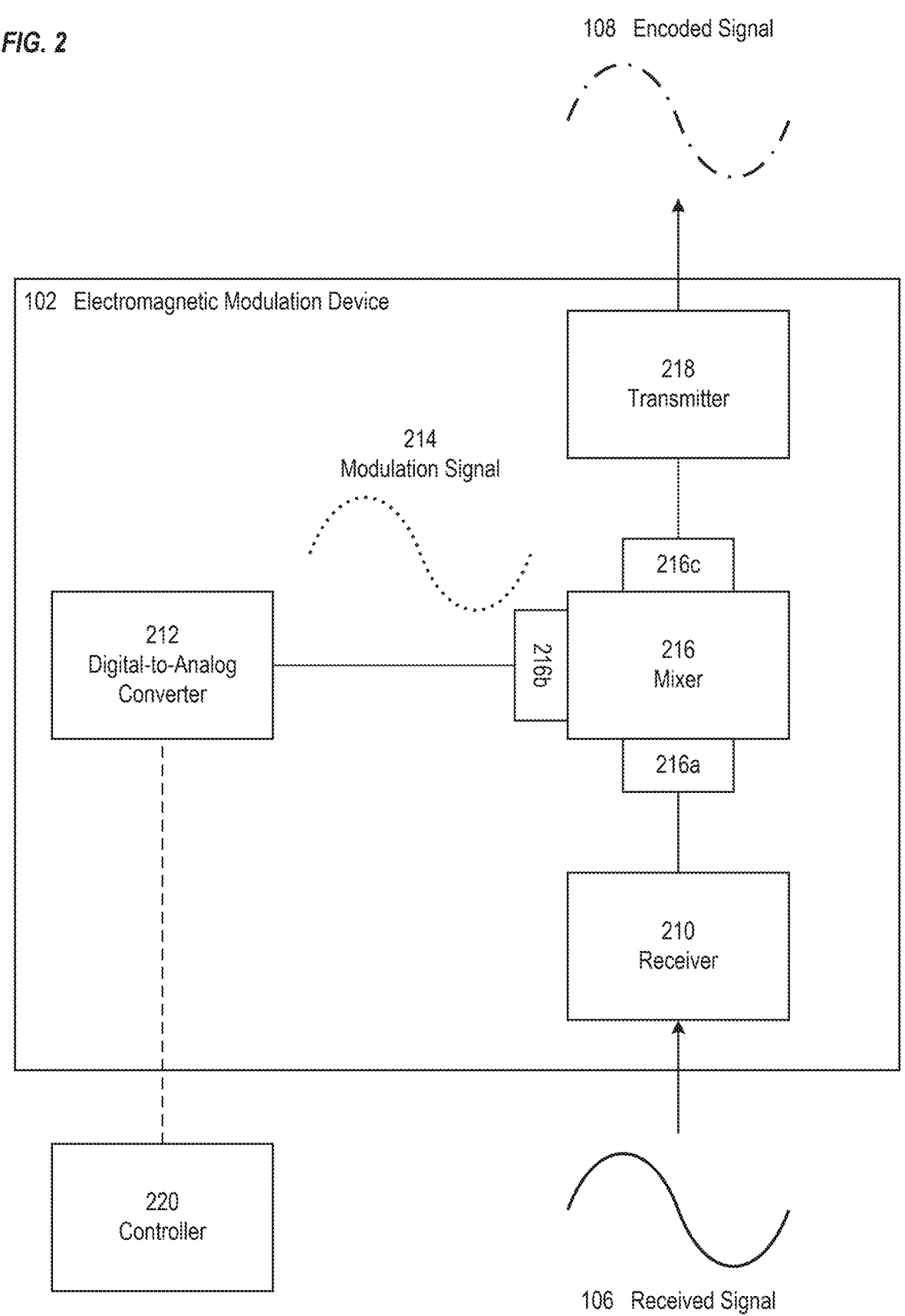
FIG. 2 shows an electromagnetic modulation device, according to some embodiments.

A block diagram of an exemplary electromagnetic modulation device 102 is provided in FIG. 2. As shown, device 102 may include a receiver 210 for receiving incoming electromagnetic signals 106 (e.g., signals emitted by a source such as source device 104), a digital-to-analog converter (DAC) 212 for generating a modulation signal 214, an analog mixer 216 for mixing incoming signals 106 with modulation signal 214, and a transmitter 218 for retransmitting encoded signal 108, which may be a mixture of modulation signal 214 and incoming signals 106.

Receiver 210 and transmitter 218 may be any suitable devices for receiving and transmitting electromagnetic radiation. Receiver 210 may be configured to convert received electromagnetic waves into electric current, while transmitter 218 may be configured to convert electric current into electromagnetic waves. Receiver 210 and transmitter 218 may be or may comprise antennas such as radio frequency (RF) antennas. In some embodiments, receiver 210 and transmitter 218 are separate devices. In other embodiments, receiver 210 and transmitter 218 are implemented using the same device (e.g., an electromagnetic transceiver).

Receiver 210 and transmitter 218 may each contain a unique antenna that enables simultaneous transmission and receiving via high isolation or low system gain. This may prevent device 102 from receiving and mixing with modulation signal 214 a signal that it transmitted.

DAC 212 may be any suitable device or system (e.g., an integrated circuit) for transforming digital electronic signals into analog electronic signals. That is, DAC 212 may be a device or a system that is configured to transform digital data into a physical quantity such as a voltage. DAC 212 may be any digital-to-analog converter capable of outputting a necessary bandwidth of signals. For example, if device 102 is configured to modulate a 10 MHz bandwidth, DAC 212 may be a 20 MHZ-30 MHZ digital-to-analog converter.

DAC 212 may be controlled using a controller 220. Controller 220 can include one or more processors (e.g., one or more CPUs), memory (e.g., flash memory), and one or more input/output peripherals. In some embodiments, DAC 212 is a component of controller 220. Controller 220 may be configured to transmit digital modulation information to DAC 212. DAC 212 may use the digital modulation information to generate modulation signal 214. A user may interface with controller 220 to adjust characteristics of modulation signal 214, for example a frequency of modulation signal 214, an amplitude of modulation signal 214, a phase of modulation signal 214, a wavelength of modulation signal 214, or a combination thereof.

Controller 220 may be a component of device 102, in which case DAC 212 may be a component of controller 220. For example, if controller 220 is a component of device 102, controller 220 may be a microcontroller that includes a digital-to-analog converter (e.g., Precision Analog Microcontroller ARM7TDMIR MCU with 12-Bit ADC and DDS DAC (part number ADUC7128)). Alternatively, controller 220 may be a component of a remote device (e.g., a remote computer system) that is configured to communicatively couple to DAC 212, for example via a wireless or a wired connection.

Modulation signal 214 may be produced by generating a digital signal (e.g., using a processor or digital control circuit), transmitting the digital signal to DAC 212, and transforming the digital signal to an analog signal using DAC 212. The digital signal that is converted into the analog modulation signal 214 may be programmed by a user or may be determined automatically by the processor or digital control circuit based on, e.g., properties of incoming signals 106. For example, the digital signal that is converted into modulation signal 214 may be determined based on frequencies of signals that constitute incoming signals 106. Modulation signal 214 may be continuously generated (e.g., emitted at regular intervals) while device 102 is in use.

Analog mixer 216 may be any suitable device or system (e.g., circuit) for combining two or more analog signals to produce one or more composite analog signals. Analog mixer 216 may comprise a local oscillator port 216a, an intermediate frequency port 216b, and an output port 216c. Upon receipt by receiver 210, incoming signals 216 may be input into analog mixer 216 via local oscillator port 216a. Modulation signal 214 may be continuously generated and transmitted by DAC 212 to mixer 216 via intermediate frequency port 216b. Analog mixer 216 may combine modulation signal 214 with incoming signals 216 to produce encoded signals 218, which may be a composite of modulation signal and incoming signals 216. Encoded signals 218 may be output from mixer 216 via output port 216c.

The continuous generation of modulation signal 214 therefore ensures that device 102 is able to produce encoded signals 218 whenever incoming signals 216 are received. In some embodiments, a delay between the receipt of incoming signals 216 and the emission of encoded signals 218 is less than or equal to 5 nanoseconds, 4.9 nanoseconds, 4.8 nanoseconds, 4.7 nanoseconds, 4.6 nanoseconds, 4.5 nanoseconds, 4.4 nanoseconds, 4.3 nanoseconds, 4.2 nanoseconds, 4.1 nanoseconds, 4 nanoseconds, 3.9 nanoseconds, 3.8 nanoseconds, 3.7 nanoseconds, 3.6 nanoseconds, 3.5 nanoseconds, 3.4 nanoseconds, 3.3 nanoseconds, 3.2 nanoseconds, 3.1 nanoseconds, 3 nanoseconds, 2.9 nanoseconds, 2.8 nanoseconds, 2.7 nanoseconds, 2.6 nanoseconds, or 2.5 nanoseconds.

Incoming signals 106 may comprise one or more types of electromagnetic waves, ranging from microwaves to gamma radiation. For example, incoming signals 106 may include electromagnetic signals with frequencies between 104 Hz and 108 Hz, between 108 Hz and 1012 Hz, between 1012 Hz. and 1016 Hz, between 1016 Hz. and 1018 Hz, or between 1018 Hz. and 1020 Hz. In some embodiments, incoming signals 106 include electromagnetic signals with frequencies of about 100 kHz. 200 kHz, 300 kHz, 400 kHz, 500 kHz, 600 kHz, 700 kHz, 800 kHz, 900 kHz, 1 MHZ, 100 MHZ, 200 MHZ, 300 MHZ, 400 MHZ, 500 MHz, 600 MHZ, 700 MHZ, 800 MHZ, 900 MHZ, 1 GHZ, 100 GHz, 200 GHz, 300 GHZ, 400 GHz, 500 GHz, 600 GHZ, 700 GHZ, 800 GHZ, 900 GHZ, 1 THz, 100 THz, 200 THz, 300 THz, 400 THz, 500 THz, 600 THz, 700 THz, 800 THz, or 900 THz. In other embodiments, incoming signals 106 include electromagnetic signals with frequencies below 104 Hz or above 1020 Hz.

Figure 3:
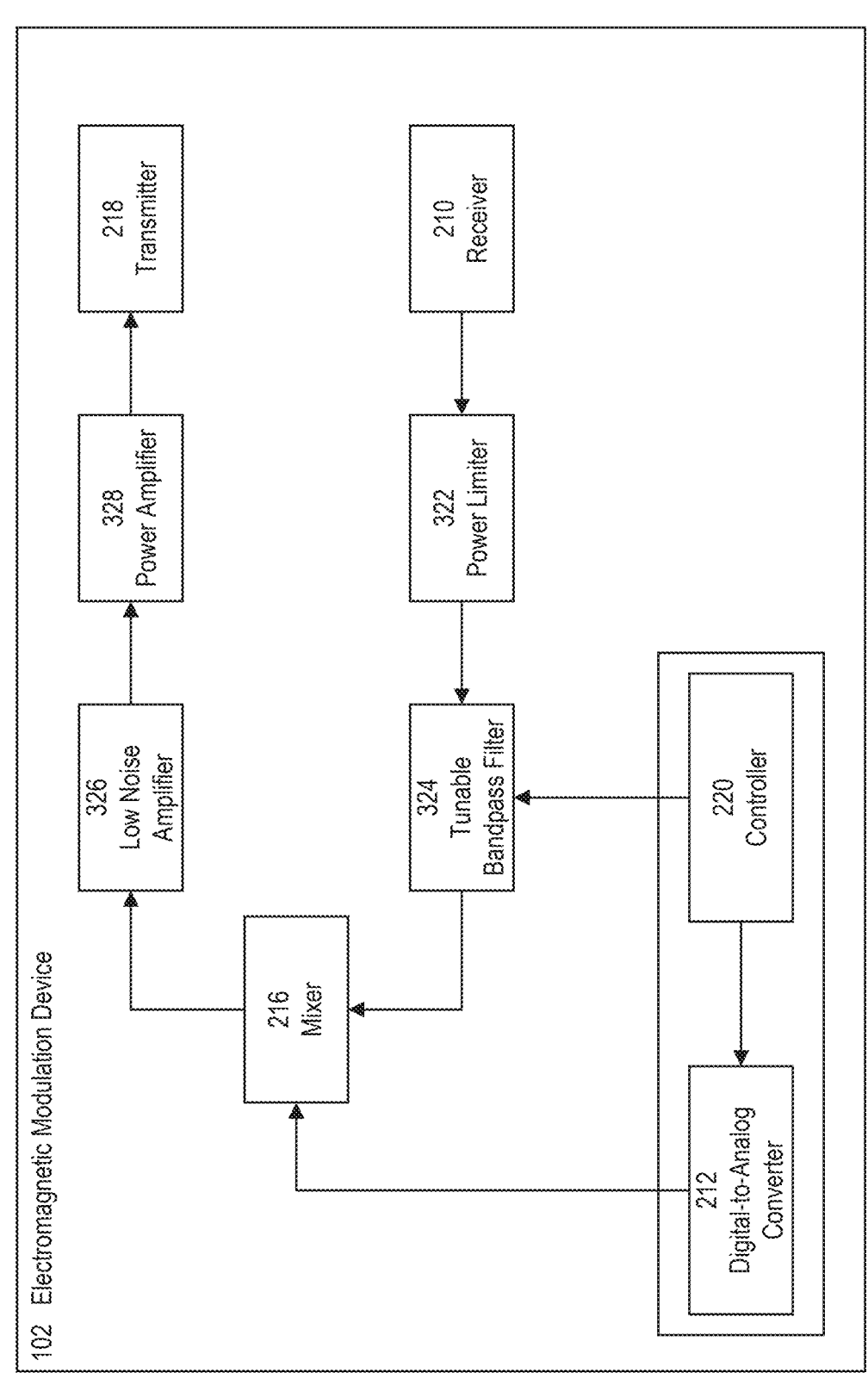
FIG. 3 shows an electromagnetic modulation device, according to some embodiments.

In addition to the aforementioned components, an electromagnetic modulation device can include one or more components for, e.g., controlling the power of received electromagnetic signals or amplifying the encoded electromagnetic signals. FIG. 3 provides a block diagram of another exemplary embodiment of electromagnetic modulation device 102. Like the embodiment depicted in FIG. 2, the embodiment of device 102 shown in FIG. 3 includes a receiver 210 for receiving incoming electromagnetic signals (e.g., signals emitted by a source such as source device 104), a digital-to-analog converter (DAC) 212 for generating a modulation signal (e.g., modulation signal 214 shown in FIG. 2), an analog mixer 216 for mixing the incoming signals received by receiver 210 with the modulation signal generated by DAC 212, and a transmitter 218 for retransmitting an encoded signal that comprises a combination of the incoming signals and the modulation signal. In this embodiment, controller 220 is a component of device 102. As shown in FIG. 3, device 102 can further comprise a power limiter 322, a tunable bandpass filter 324, a low noise amplifier 326, a power amplifier 328, or combinations thereof.

Power limiter 322 may be a component of or electrically coupled to receiver 210. Power limiter 322 may any suitable device or system (e.g., any suitable circuit) configured to pass electrical signals below a threshold power level and to reduce the power of any electrical signals above the threshold power level. If receiver 210 receives an electromagnetic signal that exceeds a threshold power level associated with power limiter 322, power limiter 322 may attenuate said signal before the signal is transmitted to mixer 216. The threshold power level associated with power limiter 322 may depend on the maximum power that analog mixer 216 is capable of consuming without damage or degradations in performance. If, for example, a maximum input to analog mixer 216 is +20 dBm, the threshold power level associated with power limiter 322 may be less than +20 dBm, for example about 19.5 dBm, about 19 dBm, about 18.5 dBm, about 18 dBm, about 17.5 dBm, about 17 dBm, about 16.5 dBm, about 16 dBm, about 15.5 dBm, or about 15 dBm. Power limiter 322 may be implemented using, e.g., Qorvo's TGL2217-SM RF power limiter.

Tunable bandpass filter 324 may be a component of or electrically coupled to receiver 210. Tunable bandpass filter 324 may be any suitable device or system (e.g., any suitable circuit) configured to pass electrical signals in a certain frequency range and reject electrical signals outside said frequency range. That is, tunable bandpass filter 324 may allow electrical signals in a certain frequency range to be passed to mixer 216 while preventing electrical signals outside said frequency range from reaching mixer 216. The frequency range that is allowable by tunable bandpass filter 324 may be adjustable (e.g., by a user) and may be set based on the task for which device 102 is being utilized. For example, if device 102 is a component of a radar jammer, then tunable bandpass filter 324 may be configured to pass signals in a frequency range used by radar transmitters. Similarly, if device 102 is a component of a RFID tag, then tunable bandpass filter 324 may be configured to pass signals in a frequency range used by a RFID reader. In some embodiments, tunable bandpass filter is implemented using a digitally tunable high-pass and low-pass filter such as Analog Devices Inc.'s 2 GHz to 18 GHz digitally tunable high-pass and low-pass filter (part number ADMV8818)).

In other embodiments, a switched filter bank is used instead of tunable bandpass filter 324. The switched filter bank may comprise a plurality of filters, each of which may be configured to reject electrical signals in a certain frequency range. A plurality of switches may connect the plurality of filters to the input of the filter bank. Filtering signals in a given frequency range may comprise closing a switch that couples a filter that rejects signals in that frequency range to the filter bank input.

As discussed, controller 220 may be a microcontroller (e.g., an integrated circuit) that is configured to control DAC 212 and (if present) tunable bandpass filter 324. Users may control various components or functions of device 102 using controller 220. For example, a user may use controller 220 to change one or more properties of the modulation signal produced by DAC 212 or to change the frequency range that is allowable by tunable bandpass filter 324.

Low noise amplifier 326 may be electrically coupled to mixer 216 and may be any suitable device or system (e.g., any circuit) configured to amplify signals received from mixer 216 without degrading the signal-to-noise ratio of said signals. Low noise amplifier 326 can be implemented using. e.g., Qorvo's CMD295C4 amplifier. Power amplifier 328 may be electrically coupled to mixer 216 and may be any suitable device or system (e.g., any circuit) configured to increase the power of signals received from mixer 216 before the signals are passed to transmitter 218. Power amplifier 328 may be implemented using, e.g., Qorvo's QPA2213 power amplifier.

Figure 4A:
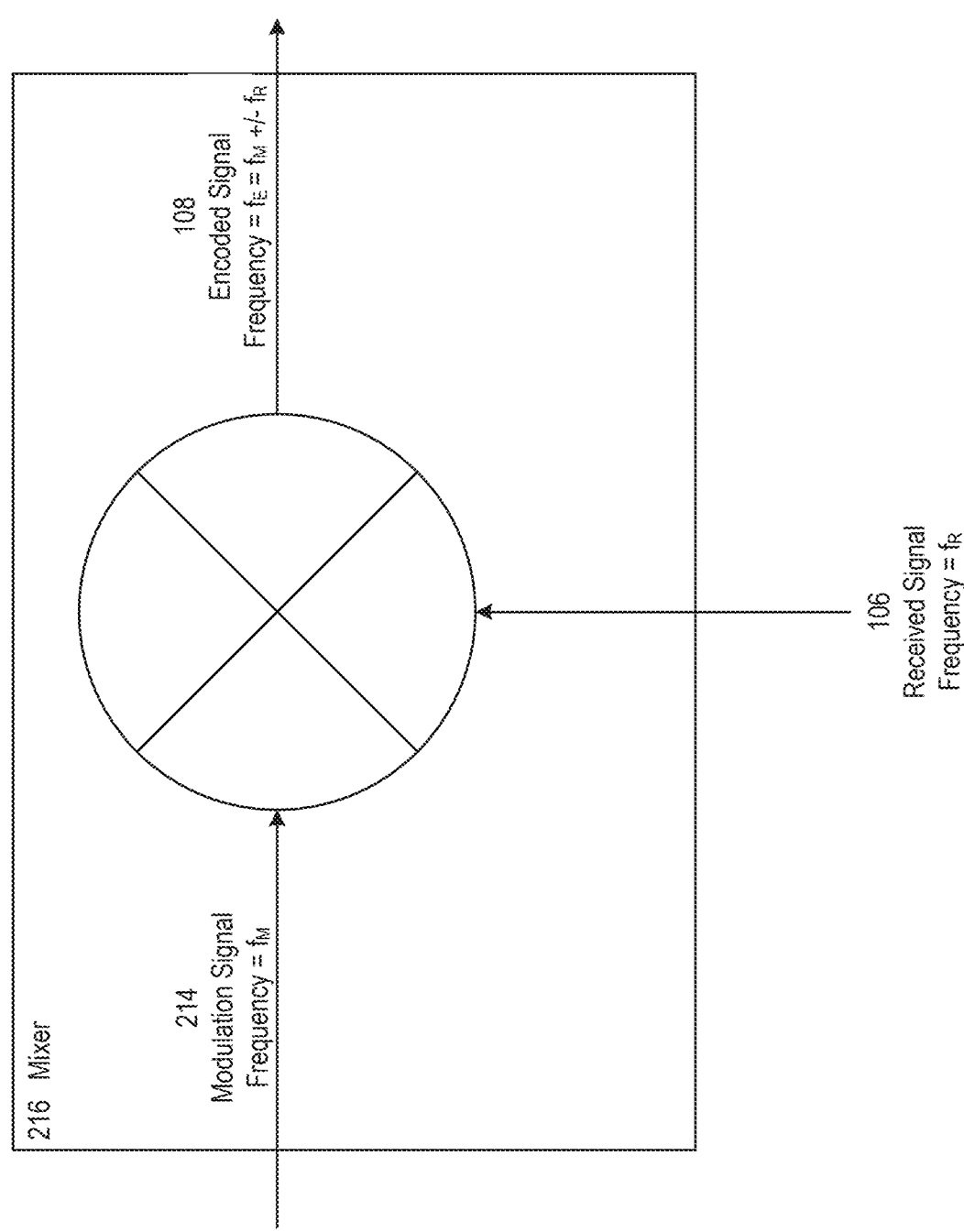
FIG. 4A shows a single side band mixer, according to some embodiments.
Figure 4B:
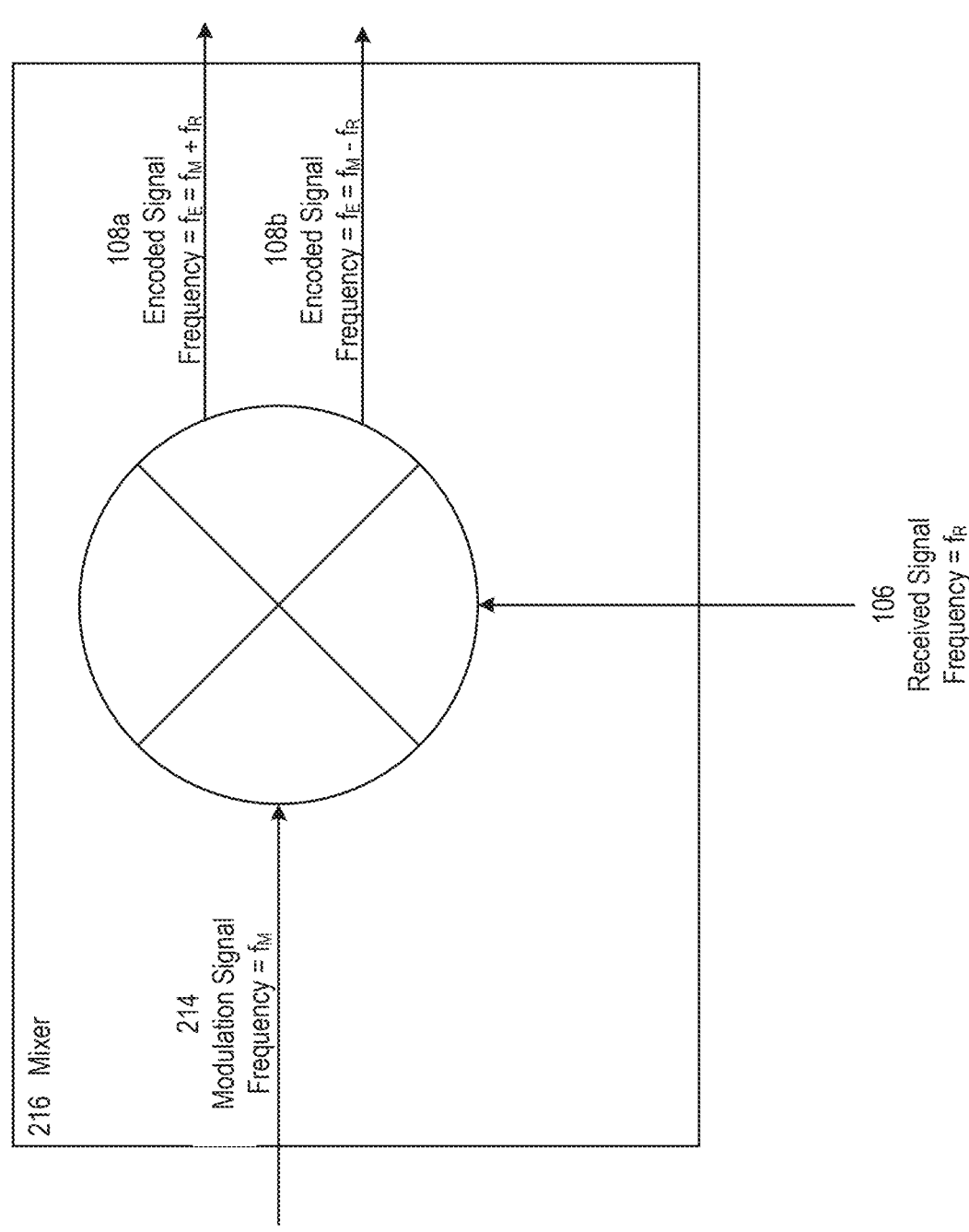
FIG. 4B shows a heterodyne mixer, according to some embodiments.

As previously noted, the analog mixer (e.g., mixer 216) in an electromagnetic modulation device (e.g., device 102) may be any suitable device or system (e.g., circuit) for combining two or more analog signals to produce one or more composite analog signals. For example, the analog mixer may be a single sideband mixer (as shown in FIG. 4A)

or a heterodyne mixer (as shown in FIG. 4B). In an electromagnetic modulation device (e.g., device 102), a single sideband mixer may combine a received electromagnetic signal 106 that has a frequency $f_R$ with a modulation signal 214 that has a frequency $f_M$ to produce an encoded signal 108 that has a frequency $f_E=f_M+f_R$ or a frequency $f_E=f_M-f_R$. A heterodyne mixer, on the other hand, may combine a received electromagnetic signal 106 that has a frequency $f_R$ with a modulation signal 214 that has a frequency $f_M$ to produce a first encoded signal 108a that has a frequency $f_E=f_M+f_R$ and a second encoded signal 108b that has frequency $f_E=f_M-f_R$.

Figure 5:
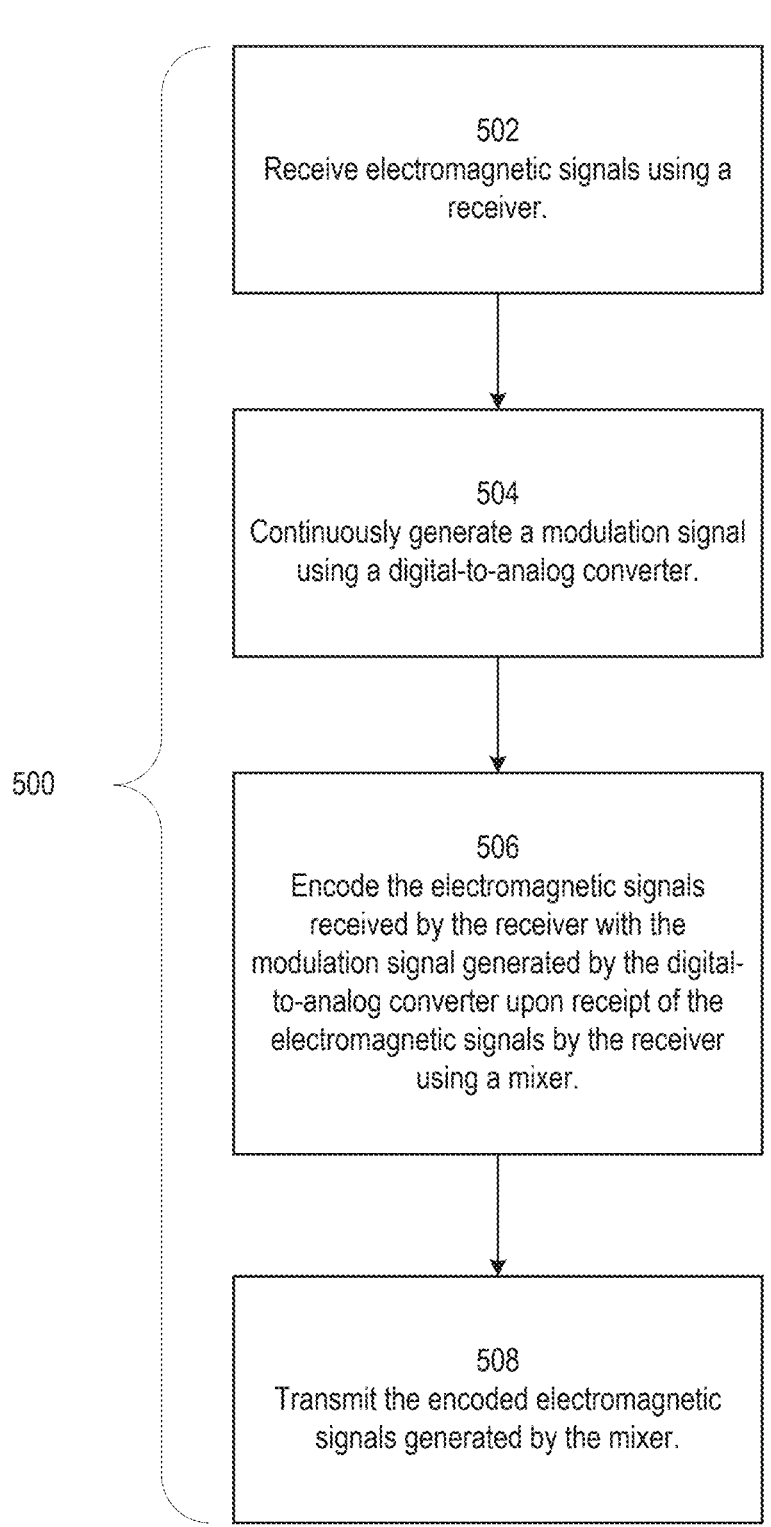
FIG. 5 shows a method for modulating electromagnetic signals, according to some embodiments.

A method 500 for modulating electromagnetic signals using an electromagnetic modulation device such as device 102 is provided in FIG. 5. Method 500 can be executed in any situation where there exists a need to produce electromagnetic signals in response to electromagnetic signals produced by another source. For example, method 500 may be used to protect against radar detection or to communicate with RFID tags.

In a first step of method 500, electromagnetic signals may be received using a receiver (e.g., receiver 210) in the electromagnetic modulation device. The received electromagnetic signals may be produced by a source device (e.g., source device 104 shown in FIG. 1) such as a radar transmitter or a RFID reader. Upon receipt, the electromagnetic signals may be converted into electric current (e.g., by an antenna) and passed through a power limiter (e.g., power limiter 322 shown in FIG. 3), which may attenuate any signals that have a power exceeding a threshold power level. If a specific electromagnetic frequency range is expected or of interest, the received signals may be passed through a tunable bandpass filter (e.g., tunable bandpass filter 324 shown in FIG. 3) for which the expected frequency range or frequency range of interest is allowable.

Simultaneously, a digital-to-analog converter (e.g., DAC 212) may be used to continuously generate a modulation signal (step 504). Various properties of the modulation signal such as its frequency, phase, or wavelength may depend on the use-case of method 500. A modulation signal that is generated by an electromagnetic modulation device in a radar jamming system, for example, may have different properties than a modulation signal that is generated by an electromagnetic modulation device in a RFID tag. The modulation signal may be generated automatically, for example by a microcontroller that controls the digital-to-analog converter.

The received electromagnetic signals and the modulation signal may be passed to an analog mixer (e.g., mixer 216), which may encode the received electromagnetic signals with the modulation signal by combining the received electromagnetic signals with the modulation signal (step 506). Since the modulation signals are continuously generated by the digital-to-analog converter, the encoded (that is, mixed) signals may be produced whenever incoming electromagnetic signals are received. The encoded signals output by the analog mixer may be passed to a low noise amplifier, which may amplify the encoded signals. If the power level of the encoded signals is low (e.g., below a threshold power level), the encoded signals can be passed through a power amplifier to increase their power. Subsequently, the encoded signals output by the analog mixer may be transmitted off of the electromagnetic modulation device using a transmitter (e.g., transmitter 218). In some embodiments, the transmitter may transmit the encoded signals back to the source of the received electromagnetic signals (e.g., source device 104).

Figure 6A:
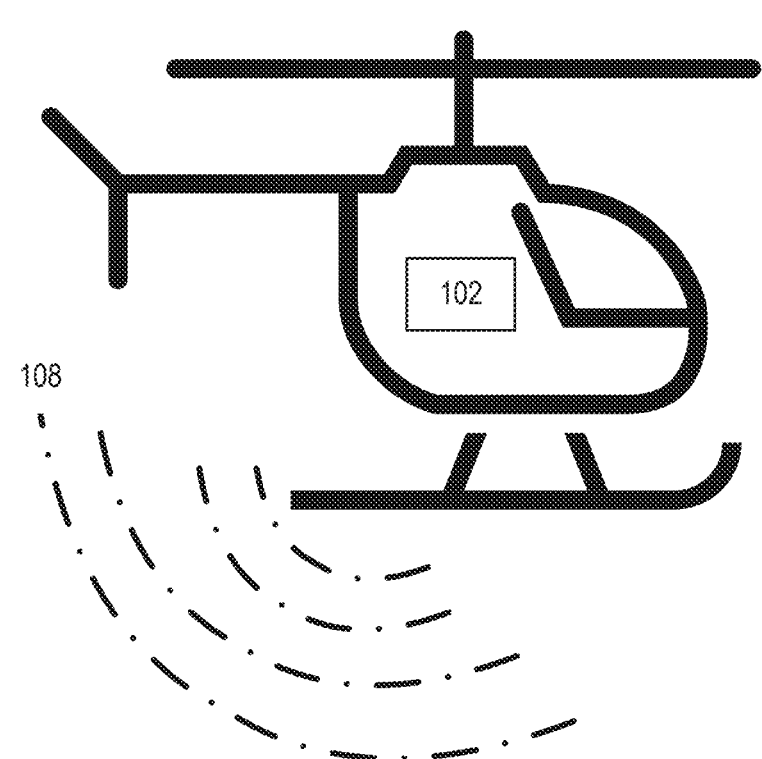
FIG. 6A shows an electromagnetic modulation device for radar jamming, according to some embodiments.
Figure 6A:
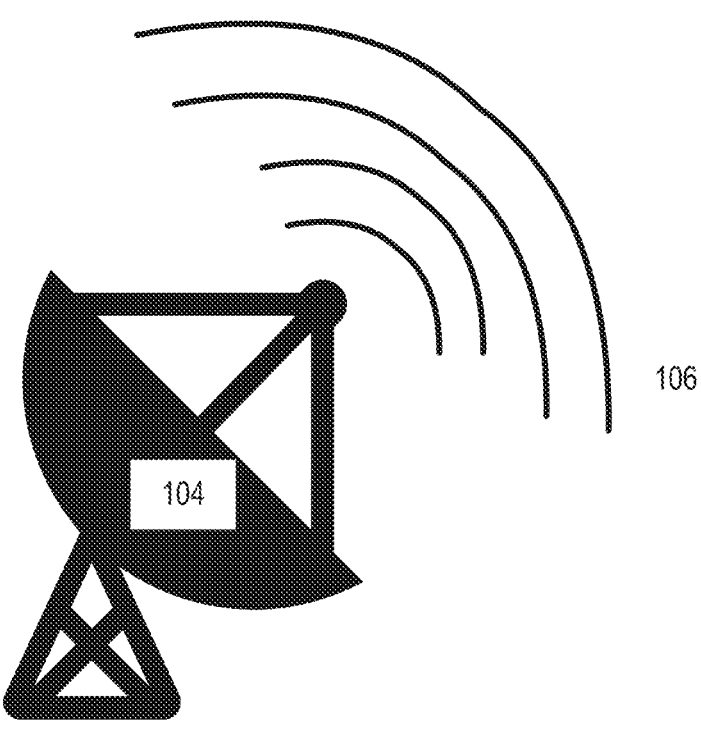

FIG. 6A illustrates a first example use-case of an electromagnetic modulation device. In this example use-case, electromagnetic modulation device 102 is a component of a radar jamming system in an aircraft. Device 102 (or, more specifically, the digital-to-analog converter in device 102) may continuously produce modulation signals while the aircraft is travelling in a region in which detection by radar is undesirable. The modulation signal may be configured to change incoming radar signals 106 as little as possible. For example, the modulation signal may change a frequency or a frequency content of incoming radar signals 106. If the aircraft flies within range of a radar source 104, device 102 may receive and modulate incoming radar signals 106 and then retransmit encoded signals 108. Encoded signals 108 may be received by radar source 104 and may prevent radar source 104 from determining the location or velocity of the aircraft.

Figure 6B:
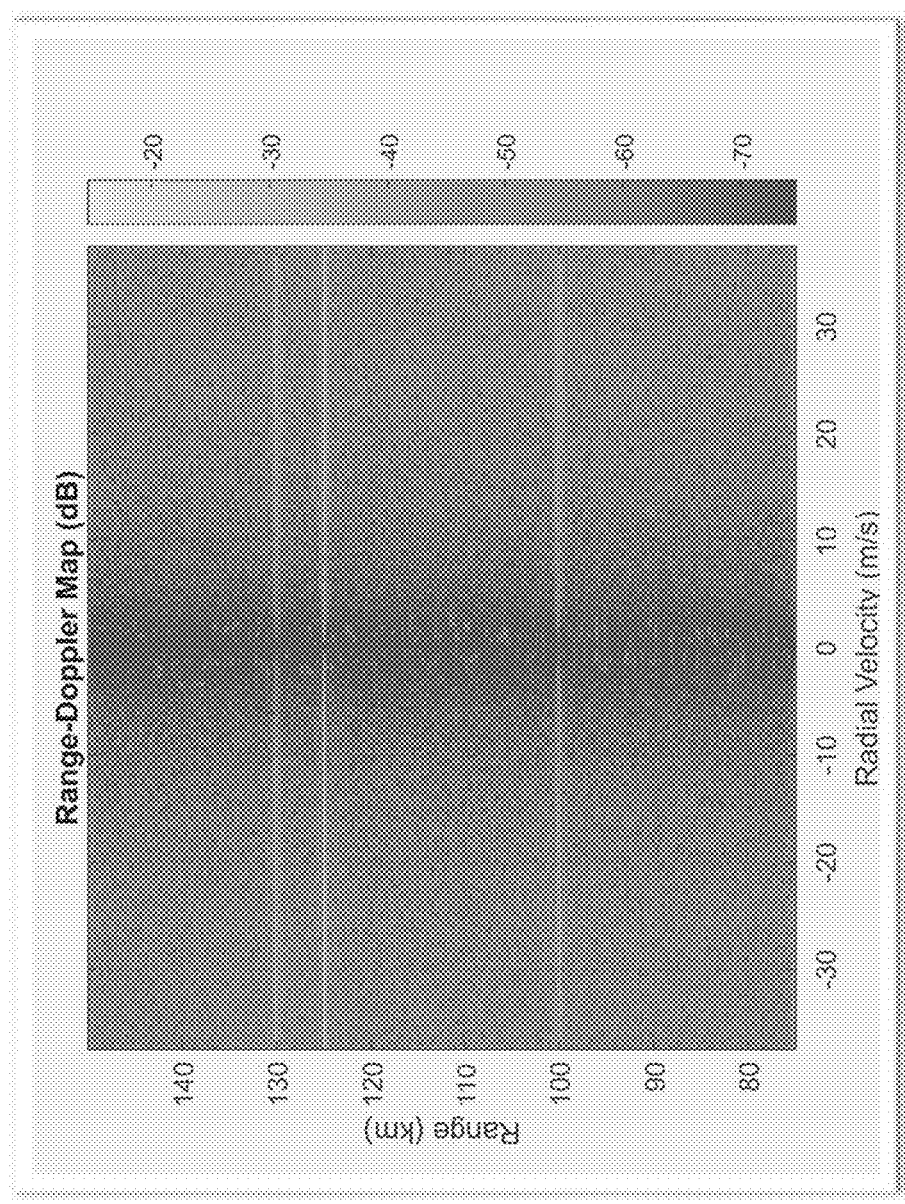
FIG. 6B shows example range-Doppler data associated with an electromagnetic modulation device in a radar jamming system.
Figure 6C:
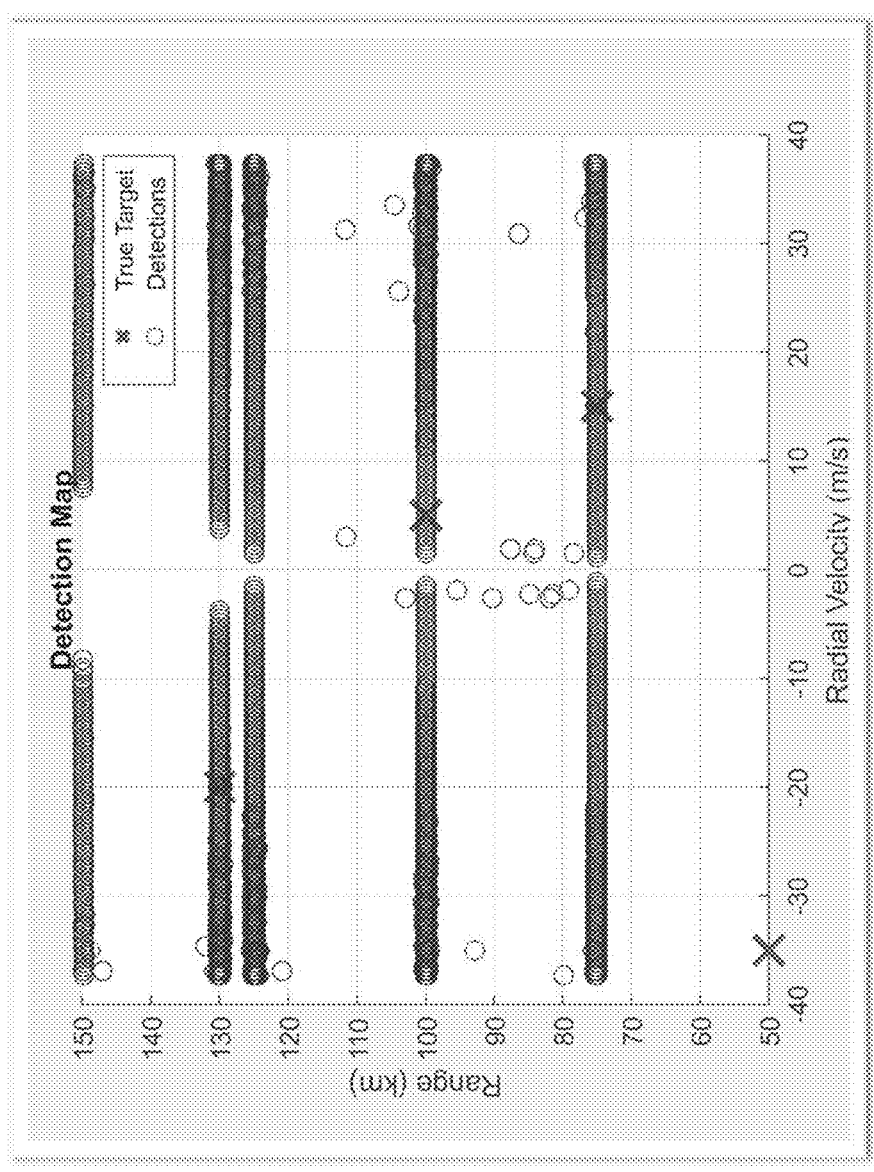
FIG. 6C shows example radar detection data associated with an electromagnetic modulation device in a radar jamming system.

FIGS. 6B-6C show example data that illustrates how an electromagnetic modulation device (e.g., device 102) can prevent radar detection of a target. In this example, a simulation was performed in which range-Doppler radar was used to attempt to detect a target that included an electromagnetic modulation device. The encoded signals emitted by the electromagnetic modulation device prevented the radar system from detecting the velocity of the target.

Figure 7:
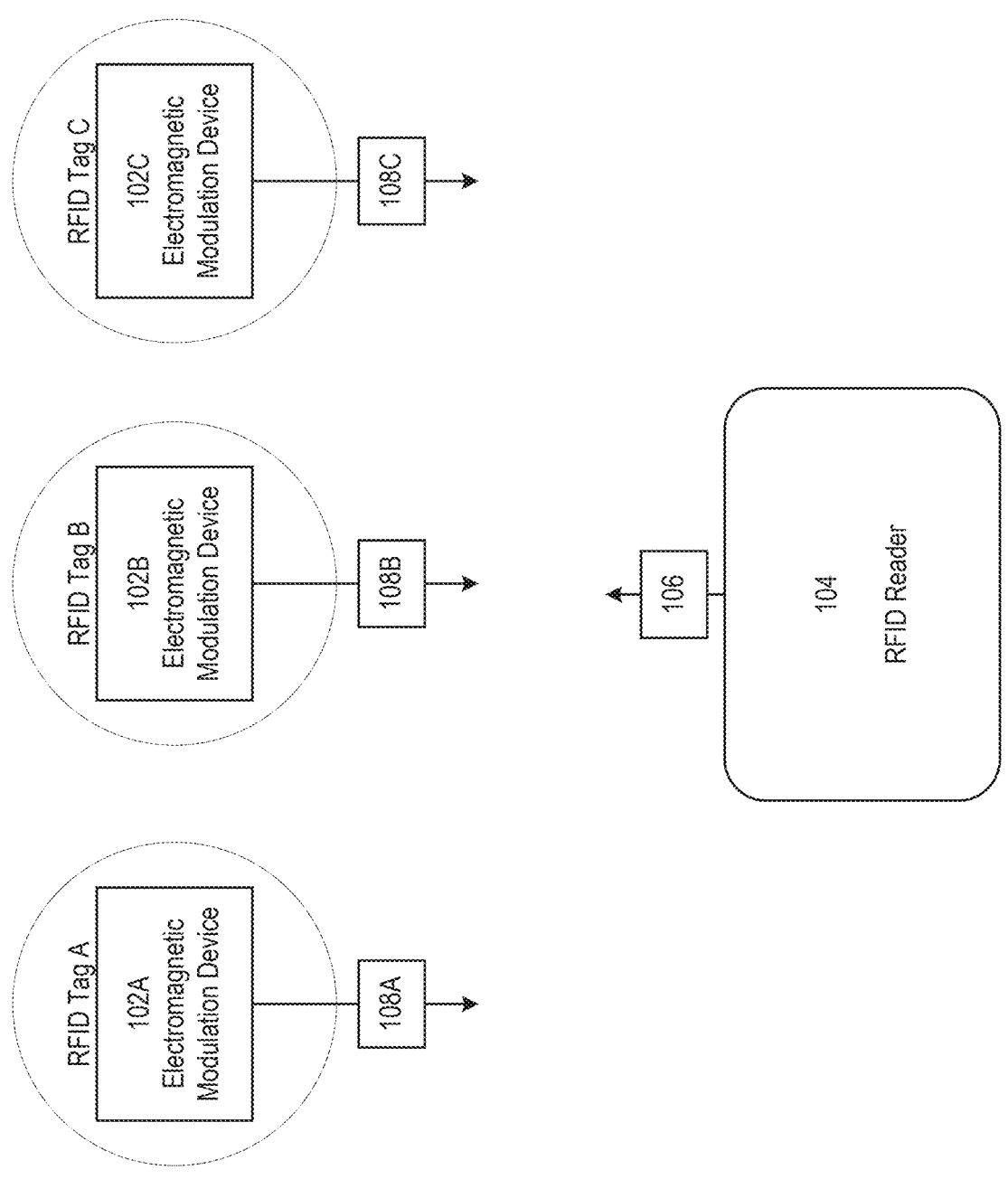
FIG. 7 shows a RFID system with RFID tags that include electromagnetic modulation devices, according to some embodiments.

A second example use-case of an electromagnetic modulation device is illustrated in FIG. 7. In this example, electromagnetic modulation devices 102A, 102B, 102C are components of RFID tags A, B, and C, respectively. Each modulation device 102A-102C may continuously produce modulation signals. The modulation signals produced by device 102A may be distinct from the modulation signals produced by device 102B, which may, in turn, be distinct from the modulation signals produced by device 102C. Each modulation signal may be produced using a modulation scheme such as Binary Phased Shift Keying or Amplitude Modulation. In some embodiments, the modulation signals produced by each modulation device 102A-102C may comprise information about the RFID tag of which the respective modulation device is a component. For example, the modulation signals produced by device 102A may include information about a location of RFID tag A or information about the environmental conditions (e.g., the temperature) to which RFID tag A is subject.

A RFID reader 104 may transmit signals 106 to RFID tags A-C. Devices 102A-102C may receive signals 106. Each device 102A-102C may modulate received signals 106 with its respective modulation signal to produce encoded signals 108A-108C, respectively. Since the modulation signal produced by each device 102A-102C is unique, the encoded signals 108A-108C that are emitted by devices 102A-102C are unique and, thus, may be distinguishable by RFID reader 104. That is, the electromagnetic modulation devices may allow a single RFID reader to receive and process information from multiple RFID tags simultaneously.

The foregoing description, for the purpose of explanation, has been described with reference to specific embodiments and/or examples. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

The invention claimed is:

1. An electromagnetic modulation device comprising:
a receiver configured to receive electromagnetic signals;
a digital-to-analog converter configured to continuously generate a modulation signal configured to interfere with the received electromagnetic signals;
a mixer coupled to the receiver and the digital-to-analog converter and configured to encode the electromagnetic signals received by the receiver with the modulation signal generated by the digital-to-analog converter upon receipt of the electromagnetic signals by the receiver; and
a transmitter coupled to the mixer and configured to transmit the encoded electromagnetic signals generated by the mixer,
wherein the encoded electromagnetic signals are configured to prevent detection of a location of the electromagnetic modulation device.

2. The electromagnetic modulation device of claim 1, wherein the received electromagnetic signals are input into the mixer through a local oscillator port of the mixer.

3. The electromagnetic modulation device of claim 1, comprising a power limiter coupled to the receiver and configured to attenuate an electromagnetic signal received by the receiver before the electromagnetic signal is transferred to the mixer if a power of the electromagnetic signal exceeds a threshold power level.

4. The electromagnetic modulation device of claim 1, comprising a microcontroller configured to control the digital-to-analog converter.

5. The electromagnetic modulation device of claim 4, wherein the microcontroller is configured to control a frequency of the modulation signal, an amplitude of the modulation signal, a phase of the modulation signal, a wavelength of the modulation signal, or a combination thereof.

6. The electromagnetic modulation device of claim 1, comprising a tunable bandpass filter coupled to the receiver and configured to remove signals in one or more frequency ranges from the electromagnetic signals received by the receiver before the electromagnetic signals are transferred to the mixer.

7. The electromagnetic modulation device of claim 1, comprising a low-noise amplifier coupled to the mixer and configured to amplify the encoded electromagnetic signals generated by the mixer before the encoded electromagnetic signals are transferred to the transmitter.

8. The electromagnetic modulation device of claim 1, comprising a power amplifier coupled to the mixer and configured to increase a power of the encoded electromagnetic signals generated by the mixer before the encoded electromagnetic signals are transferred to the transmitter.

9. The electromagnetic modulation device of claim 1, wherein the mixer is a single side band mixer.

10. The electromagnetic modulation device of claim 1, wherein the mixer is a heterodyne mixer.

11. The electromagnetic modulation device of claim 1, wherein a frequency of the modulation signal is adjustable.

12. The electromagnetic modulation device of claim 1, wherein a frequency of the modulation signal is greater than or equal to 1 Hz and less than or equal to 300 GHz.

13. The electromagnetic modulation device of claim 1, wherein the electromagnetic signals received by the receiver are radar signals.

14. The electromagnetic modulation device of claim 1, wherein the receiver comprises a first antenna, and the transmitter comprises a second antenna.

15. The electromagnetic modulation device of claim 1, wherein the receiver and the transmitter are the same device.

16. The electromagnetic modulation device of claim 1, wherein the device requires less than 15 W of power to operate.

17. An electromagnetic modulation method using an electromagnetic modulation device, the method comprising:
receiving electromagnetic signals using a receiver;
continuously generating, using a digital-to-analog converter, a modulation signal configured to interfere with the received electromagnetic signals;
encoding the electromagnetic signals received by the receiver with the modulation signal generated by the digital-to-analog converter upon receipt of the electromagnetic signals by the receiver using a mixer; and
transmitting the encoded electromagnetic signals generated by the mixer,
wherein the encoded electromagnetic signals are configured to prevent detection of a location of the electromagnetic modulation device.

18. The method of claim 17, wherein encoding the electromagnetic signals received by the receiver with the modulation signal generated by the digital-to-analog converter upon receipt of the electromagnetic signals by the receiver using a mixer comprises inputting the received electromagnetic signals through a local oscillator port of the mixer.

19. The method of claim 17, further comprising attenuating an electromagnetic signal received by the receiver before the electromagnetic signal is transferred to the mixer if a power of the electromagnetic signal exceeds a threshold power level using a power limiter.

20. The method of claim 17, further comprising removing signals in one or more frequency ranges from the electromagnetic signals received by the receiver before the electromagnetic signals are transferred to the mixer using a tunable bandpass filter.

21. The method of claim 20, further comprising amplifying the encoded electromagnetic signals generated by the mixer before the encoded electromagnetic signals are transferred to the transmitter using a low-noise amplifier.

22. The method of claim 17, further comprising increasing a power of the encoded electromagnetic signals generated by the mixer before the encoded electromagnetic signals are transferred to the transmitter using a power amplifier.

23. The method of claim 17, wherein the electromagnetic signals received using the receiver are radar signals.

24. An electromagnetic modulation system comprising:
a source device configured to emit electromagnetic signals;
an electromagnetic modulation device comprising:
a receiver configured to receive electromagnetic signals from the source device;
a digital-to-analog converter configured to continuously generate a modulation signal configured to interfere with the received electromagnetic signals;
a mixer coupled to the receiver and the digital-to-analog converter and configured to encode the electromagnetic signals received by the receiver with the modulation signal generated by the digital-to-analog converter upon receipt of the electromagnetic signals by the receiver; and a transmitter coupled to the mixer and configured to transmit the encoded electromagnetic signals generated by the mixer, wherein the encoded electromagnetic signals are configured to prevent detection of a location of the electromagnetic modulation device.

25. The system of claim 24, wherein the received electromagnetic signals are input into the mixer through a local oscillator port of the mixer.

26. The system of claim 24, wherein the electromagnetic modulation device comprises a power limiter coupled to the receiver and configured to attenuate an electromagnetic signal received by the receiver before the electromagnetic signal is transferred to the mixer if a power of the electromagnetic signal exceeds a threshold power level.

27. The system of claim 24, comprising a microcontroller configured to control the digital-to-analog converter.

28. The system of claim 27, wherein the microcontroller is configured to control a frequency of the modulation signal, an amplitude of the modulation signal, a phase of the modulation signal, a wavelength of the modulation signal, or a combination thereof.

29. The system of claim 24, wherein the electromagnetic modulation device comprises a tunable bandpass filter coupled to the receiver and configured to remove signals in one or more frequency ranges from the electromagnetic signals received by the receiver before the electromagnetic signals are transferred to the mixer.

30. The system of claim 24, wherein the electromagnetic modulation device comprises a low-noise amplifier coupled to the mixer and configured to amplify the encoded electromagnetic signals generated by the mixer before the encoded electromagnetic signals are transferred to the transmitter.

31. The system of claim 24, wherein the electromagnetic modulation device comprises a power amplifier coupled to the mixer and configured to increase a power of the encoded electromagnetic signals generated by the mixer before the encoded electromagnetic signals are transferred to the transmitter.

32. The system of claim 24, wherein the source device is a radar transmitter, and the electromagnetic modulation device is a component of a radar jammer.

* * * * *